United States Patent
Liu

(10) Patent No.: US 8,054,133 B2
(45) Date of Patent: Nov. 8, 2011

(54) DEVICE AND METHOD FOR ELIMINATING FEEDBACK COMMON MODE SIGNALS

(75) Inventor: Yongping Liu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/073,756

(22) Filed: Mar. 28, 2011

(65) Prior Publication Data

US 2011/0169569 A1 Jul. 14, 2011

Related U.S. Application Data

(63) Continuation of application No. PCT/CN2009/074049, filed on Sep. 21, 2009.

(30) Foreign Application Priority Data

Sep. 27, 2008 (CN) .......................... 2008 1 0223410

(51) Int. Cl.
*H03F 3/45* (2006.01)
(52) U.S. Cl. ........................ 330/258; 330/260; 330/69
(58) Field of Classification Search .................. 330/258, 330/260, 69
See application file for complete search history.

(56) References Cited

U.S. PATENT DOCUMENTS

| | | | |
|---|---|---|---|
| 4,525,677 A | 6/1985 | Rorden | |
| 5,914,638 A * | 6/1999 | He | 330/258 |
| 5,939,904 A * | 8/1999 | Fetterman et al. | 327/67 |
| 6,265,941 B1 * | 7/2001 | Lopata | 330/258 |
| 6,697,001 B1 * | 2/2004 | Oliaei et al. | 341/143 |
| 7,053,712 B2 * | 5/2006 | Bonaccio et al. | 330/258 |
| 7,586,373 B2 * | 9/2009 | Kim | 330/257 |
| 7,834,696 B2 * | 11/2010 | Giotta et al. | 330/258 |

FOREIGN PATENT DOCUMENTS

| | | |
|---|---|---|
| CN | 1404218 A | 3/2003 |
| CN | 101369804 A | 2/2009 |

* cited by examiner

*Primary Examiner* — Patricia Nguyen
(74) *Attorney, Agent, or Firm* — Leydig, Voit & Mayer, Ltd.

(57) ABSTRACT

A device and a method for eliminating feedback common mode signals are provided, which belong to the electronic technology field. The device includes an operational amplifier circuit with two output ends. The two output ends are a first output end and a second output end. The device also includes a feedback unit. The feedback unit is configured to receive level signals of the first output end and the second output end of the operational amplifier circuit, and superpose feedback common mode signals to input ends of the operational amplifier circuit according to states of the level signals. The method includes: the feedback unit receives level signals of a first output end and a second output end of an operational amplifier circuit, and superposes feedback common mode signals to the input ends of the operational amplifier circuit according to the states of the level signals. Thus, the feedback common mode signals of the operational amplifier circuit are stabilized, the requirements for the operational amplifier circuit are lowered, and the performance of the operational amplifier circuit is improved.

6 Claims, 6 Drawing Sheets

DEVICE AND METHOD FOR ELIMINATING FEEDBACK COMMON MODE SIGNALS

CROSS-REFERENCE TO RELATED APPLICATIONS

This application is a continuation of International Application No. PCT/CN2009/074049, filed on Sep. 21, 2009, which claims priority to Chinese Patent Application No. 200810223410.7, filed on Sep. 27, 2008, both of which are hereby incorporated by reference in their entireties.

FIELD OF THE TECHNOLOGY

The present disclosure relates to the electronic technology field, and more particularly to a device and a method for eliminating feedback common mode signals.

BACKGROUND OF THE APPLICATION

An operational amplifier is a circuit unit that possesses a high amplification factor. In an actual circuit, an operation amplifier often forms a functional module together with a feedback circuit. Operational amplification can be achieved by an independent device or in a semiconductor chip. For a transistor amplifier, the amplifier may be a class A amplifier, a class B amplifier, a class AB amplifier or a class D amplifier.

Taking the class D amplifier for example, as shown in FIG. 1, an output structure of Bridge Tied Load (BTL) can output four states formed by high level and low level, namely, high-high, high-low, low-low and low-high. When the BTL outputs are the high level or low level at the same time, high level common mode signals or low level common mode signals may occur. In order to achieve high performance, it is inevitable for the amplifier to use feedback common mode signals. A formula for calculating the value of feedback common mode (VFCM) signals is: VFCM=(OUTP+OUTN)/n, where OUTP is the sum of all feedback signals at a BTL input positive end, OUTN is the sum of all feedback signals at a BTL input negative end, n is the number of feedback circuits, and OUTP and OUTN may be either high level AVDD or low level AGND.

FIG. 2 shows an operational amplifier circuit with feedback signals. An output Pulse Width Modulation (PWM) signal is directly transmitted back to the input ends of the operational amplifier. Because the PWM signal has very strong common mode signals, the input ends of the operational amplifier will have very strong common mode signals too. Also, OUTP and OUTN may be either high level AVDD or low level AGND, so that the value of the feedback common mode signals of the operational amplifier circuit is AGND, AVDD or AVDD/2. The feedback common mode signals of the circuit are as shown in FIG. 3.

After analyzing the conventional art, the inventors find that: because the feedback signals of an operational amplifier circuit have relatively strong common mode signals, if the feedback signals are directly transmitted back to the input ends of the operational amplifier circuit, the input ends of the operational amplifier circuit will have very strong common mode signals too. In order to guarantee the normal operation of the operational amplifier circuit, the operational amplifier circuit must have a wide common mode input range and have a high common mode rejection ratio. Otherwise the performance of the circuit will be lowered.

SUMMARY OF THE APPLICATION

The present disclosure is directed to a device and a method for eliminating feedback common mode signals so as to effectively eliminate influence of the feedback common mode signals on an operational amplifier circuit. The technical solutions are described in the following.

A device for eliminating feedback common mode signals includes an operational amplifier circuit. The operational amplifier circuit has two output ends. The two output ends are a first output end and a second output end. The device further includes a feedback unit.

The feedback unit is configured to receive level signals of the first output end and the second output end of the operational amplifier circuit, and superpose feedback common mode signals to the input ends of the operational amplifier circuit according to the states of the level signals.

A method for eliminating feedback common mode signals includes the following steps.

A feedback unit receives level signals of a first output end and a second output end of an operational amplifier circuit, and superposes feedback common mode signals to the input ends of the operational amplifier circuit according to the states of the level signals.

In the embodiments of the present disclosure, a feedback unit is added in an operational amplifier circuit, so that the overall values of feedback common mode signals of the feedback circuits are kept stable, thereby solving the problem of instability of the feedback common mode signals and lowering the requirement for the input common mode range and the common mode rejection ratio of the operational amplifier circuit. Thus, the complexity of the circuit is lowered and the overall performance of the circuit is improved.

DETAILED DESCRIPTION OF THE EMBODIMENTS

In order to make the objectives, technical solutions, and advantages of the present disclosure more comprehensible, the implementation of the present disclosure is described in further detail below with reference to the accompanying drawings.

Embodiment 1

In the embodiment of the present disclosure, a device for eliminating feedback common mode signals is provided to eliminate influence of common mode signals in an operational amplifier circuit.

Figure 1:
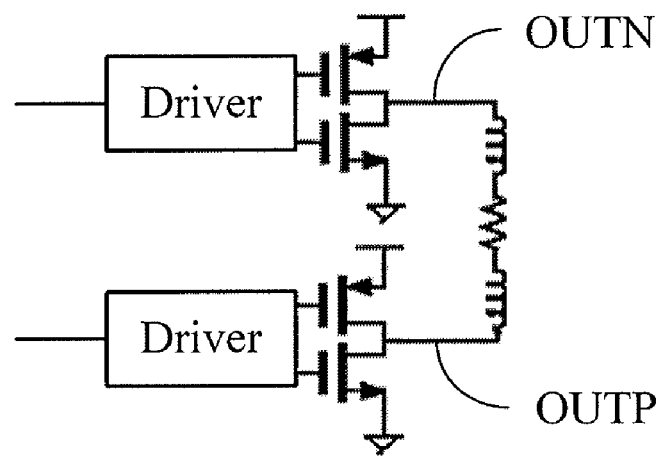
FIG. 1 is a schematic view of an output structure of the BTL in the conventional art.
Figure 2:
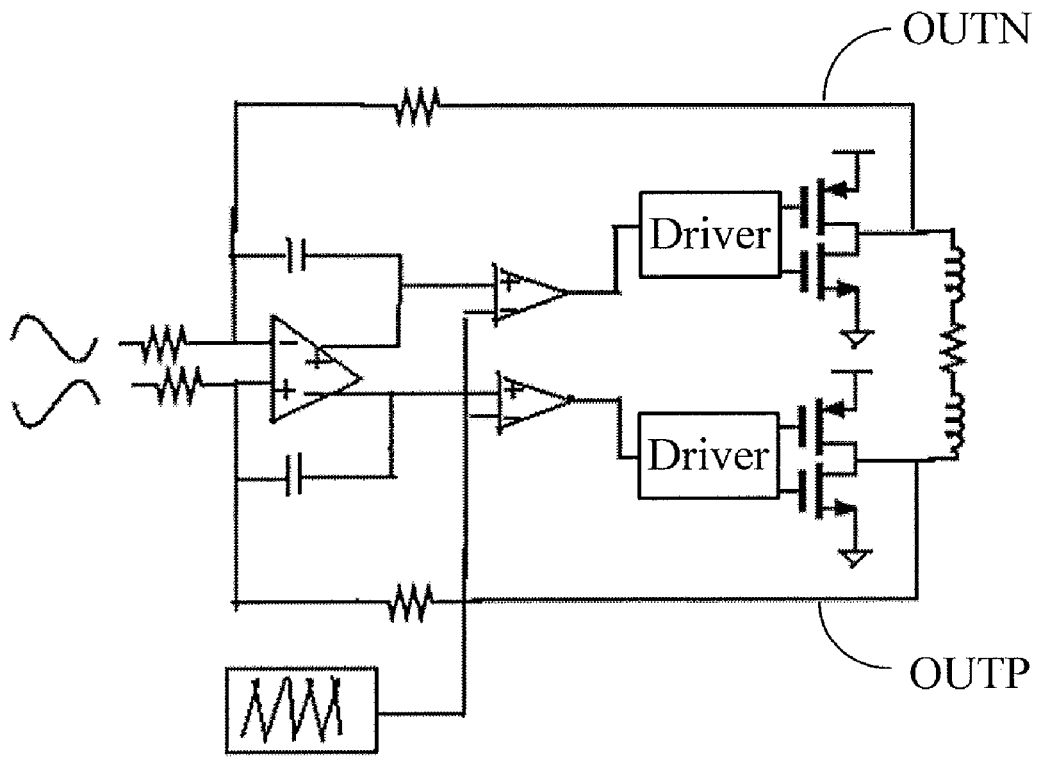
FIG. 2 is a schematic view of a feedback circuit in the conventional art.
Figure 3:
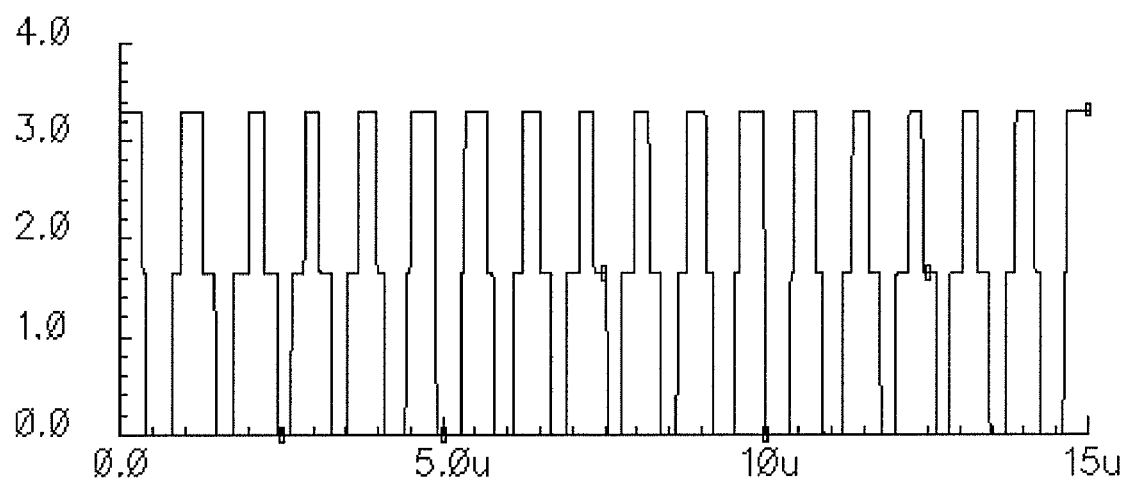
FIG. 3 is a schematic view of feedback common mode signals of an operational amplifier circuit in the conventional art.
Figure 4:
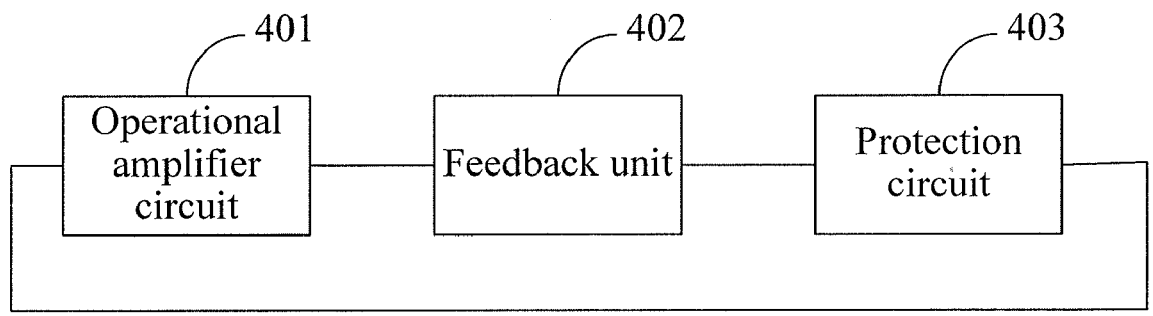
FIG. 4 is a structural view of a device for eliminating feedback common mode signals according to a first embodiment of the present disclosure.

As shown in FIG. 4, the device includes an operational amplifier circuit 401 and a feedback unit 402.

The operational amplifier circuit 401 has two output ends. The two output ends are a first output end 505 and a second output end 506.

The feedback unit 402 is configured to receive level signals of the first output end 505 and the second output end 506 of the operational amplifier circuit, and superpose feedback common mode signals to the input ends of the operational amplifier circuit 401 according to the states of the level signals.

In order to stabilize the feedback common mode signals and protect the feedback circuits, the device may further include a protection circuit 403. The protection circuit 403 includes a first parallel resistor 507 and a second parallel resistor 508. One end of the first parallel resistor 507 is connected to an output end of the feedback unit 402, and the other end of the first parallel resistor 507 is connected to one input end of the operational amplifier circuit. One end of the second parallel resistor 508 is connected to the output end of the feedback unit 402, and the other end of the second parallel resistor 508 is connected to the other input end of the operational amplifier circuit.

Figure 5:
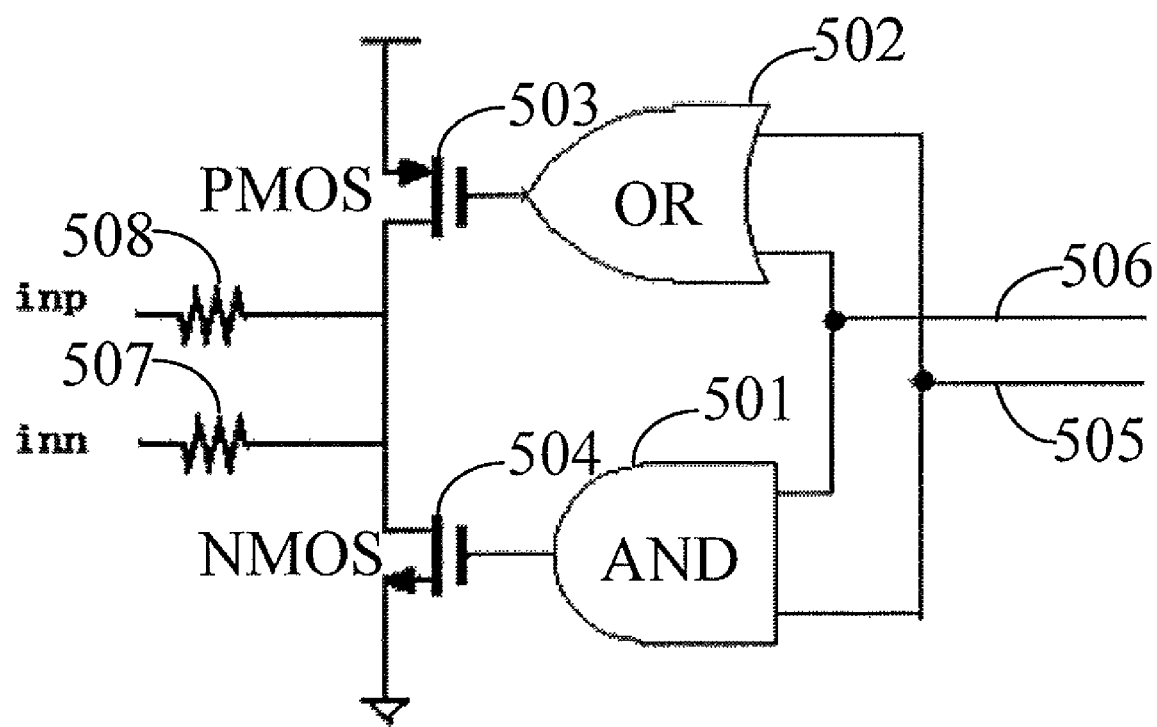
FIG. 5 is a circuit diagram of a feedback unit in the device for eliminating feedback common mode signals according to the first embodiment of the present disclosure.

FIG. 5 is a circuit diagram of the feedback unit 402 and the protection circuit 403 in the device.

Figure 6:
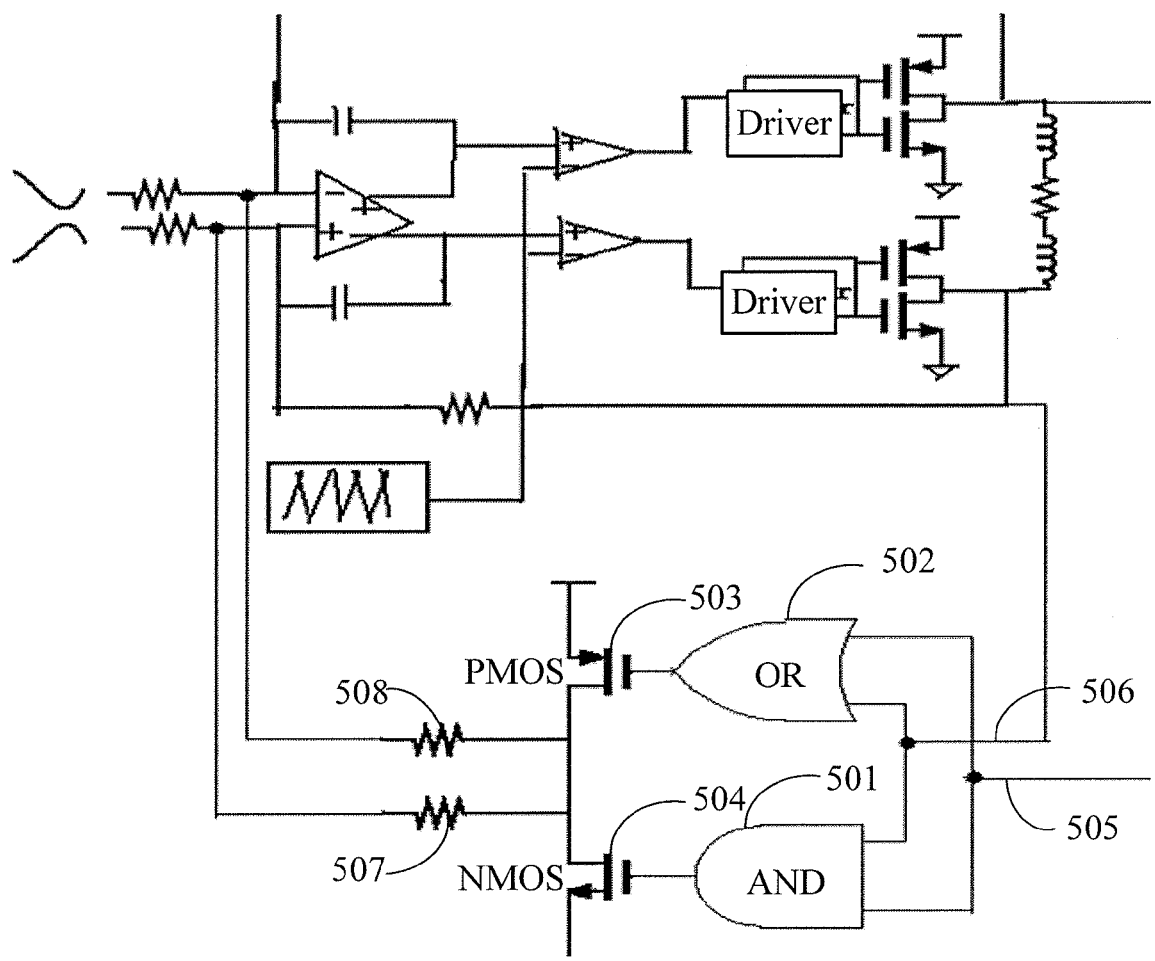
FIG. 6 is a structural view of a class D amplifier using the embodiment of the present disclosure according to the first embodiment of the present disclosure.

Specifically, the feedback unit 402 includes an AND gate 501, an OR gate 502, a P-type Metal-oxide semiconductor (PMOS) transistor 503 and an N-type Metal-oxide semiconductor (NMOS) transistor 504. The protection circuit 403 includes the first parallel resistor 507 and the second parallel resistor 508. The feedback unit 402 and the protection circuit 403 are added in the operational amplifier circuit, which are equivalent to adding two feedback circuits. Specifically, the embodiment of the present disclosure can be used in a class D amplifier. The connection of the circuits is shown in FIG. 6. The input ends of the AND gate 501 and the OR gate 502 are connected to the first output end 505 and the second output end 506 of the operational amplifier circuit respectively. For the PMOS transistor 503, the source is connected to high level, the gate is connected to the output end of the OR gate 502, and the drain is connected to the protection circuit 403. For the NMOS transistor 504, the source is connected to low level, the gate is connected to the output end of the AND gate, and the drain is connected to the protection circuit 403. The other end of the protection circuit 403 is connected to the two input ends of the operational amplifier circuit respectively, that is, the first parallel resistor 507 is connected to one input end of the operational amplifier circuit and the second parallel resistor 508 is connected to the other input end of the operational amplifier circuit.

Furthermore, the details of the working principle of the circuit shown in FIG. 6 are described in the following.

When the level signals, which are output by both the first output end 505 and the second output end 506 of the operational amplifier circuit, are high level at the same time, the control logics output by the AND gate 501 and the OR gate 502 are high level at the same time, the NMOS transistor 504 is on, the PMOS transistor 503 is off, the output end of the feedback unit 402 is low level, and two low level feedback common mode signals are superposed to the input ends of the operational amplifier circuit.

When the level signals, which are output by both the first output end 505 and the second output end 506 of the operational amplifier circuit, are low level at the same time, the output control logics of the AND gate 501 and the OR gate 502 are low level at the same time, the PMOS transistor 503 is on, the NMOS transistor 504 is off, the output end of the feedback unit 402 is high level, and two high level feedback common mode signals are superposed to the input ends of the operational amplifier circuit.

When the first output end 505 is high level and the second output end 506 is low level, or the first output end 505 is low level and the second output end 506 is high level, the control logic output by the AND gate 501 is low level, the control logic output by the OR gate 502 is high level, both the PMOS transistor 503 and the NMOS transistor 504 are off, the feedback unit 402 is in the virtual short state, and the newly added feedback signal is floating.

Furthermore, the voltage of the feedback common mode signals can be deduced theoretically. Taking the class D amplifier for example, the high level is AVDD, and the low level is AGND. According to the formula for calculating the feedback common mode signals, $VFCM=(OUTP+OUTN)/n$, as well as the function of logic circuits, the formula for calculating the value of the overall feedback common mode signals of the operational amplifier circuit after the feedback circuits are added can be obtained. The formula is as follows.

When both input ends of the operational amplifier circuit are AVDD at the same time, two common mode signals being AGND are superposed to the upper end of the original feedback common mode signals through the logic control. According to the formula, the voltage of the feedback common mode signals at the input ends of the operational amplifier circuit is $VFCM=(OUTP+OUTN)/n=2(AVDD+AGND)/4=AVDD/2$.

When both input ends of the operational amplifier circuit are AGND at the same time, two common mode signals being AVDD are superposed to the upper end of the original feedback common mode signals through the logic control. According to the formula, the voltage of the feedback common mode signal at the input ends of the operational amplifier circuit is $VFCM=(OUTP+OUTN)/n=2(AVDD+AGND)/4=AVDD/2$.

When one of the two input ends of the operational amplifier circuit is AGND and the other is AVDD, the newly added feedback signal is floating through the logic control, and no feedback is added to the original feedback circuits. According to the formula, the voltage of the feedback common mode signal at the input ends of the operational amplifier circuit is $VFCM=(OUTP+OUTN)/n=(AVDD+AGND)/2=AVDD/2$.

Figure 7:
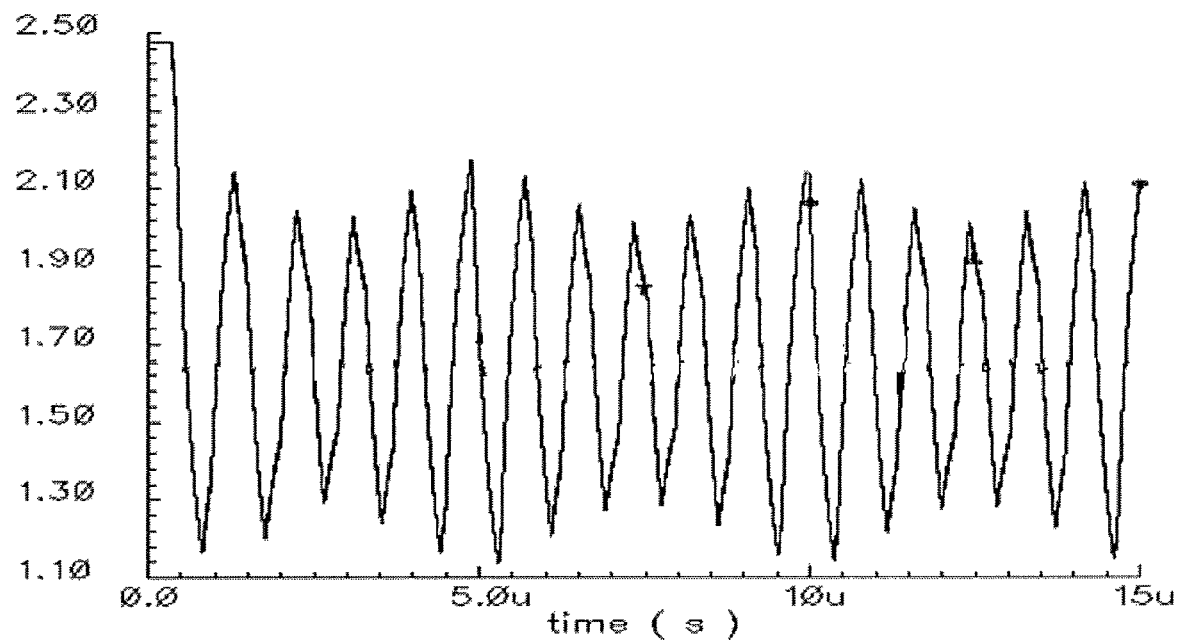
FIG. 7 is a diagram of a common mode signal before the embodiment of the present disclosure is used according to the first embodiment of the present disclosure.
Figure 8:
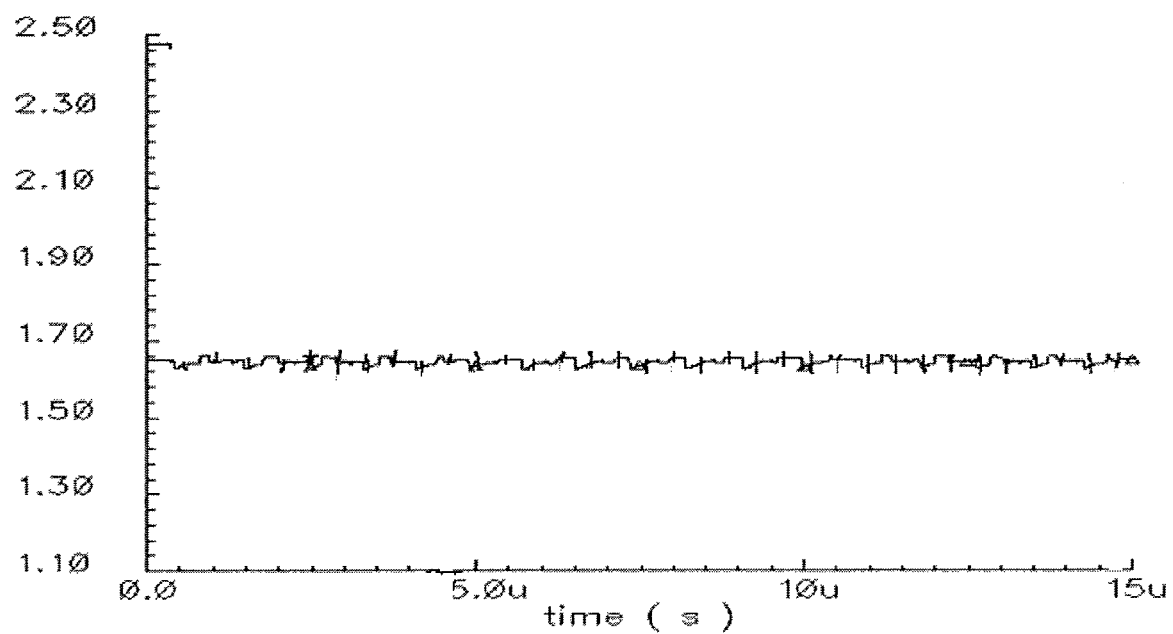
FIG. 8 is a diagram of a common mode signal after the embodiment of the present disclosure is used according to the first embodiment of the present disclosure.

In the embodiment of the present disclosure, a feedback common mode signal before the feedback unit is added is as shown in FIG. 7. The vertical coordinate is in a unit of voltage (V). The feedback common mode signal fluctuates between 1.10 V and 2.5 V. A feedback common mode signal after the feedback unit is added is as shown in FIG. 8, that is, the feedback common mode signal fluctuates around 1.66 V. It is known that after a feedback unit is added, the feedback common mode signals are maintained at a stable value, and thus the objective of stabilizing the feedback common mode signals is achieved.

In the embodiment of the present disclosure, the feedback unit is added in the operational amplifier circuit, so that the overall value of the feedback common mode signals of the feedback circuits are kept constant, thereby solving the problem of instability of the feedback common mode signals and lowering the requirement for the input common mode range and the common mode rejection ratio of the operational amplifier circuit. Thus, the complexity of the circuit is lowered and the overall performance of the circuit is improved.

Embodiment 2

Figure 9:
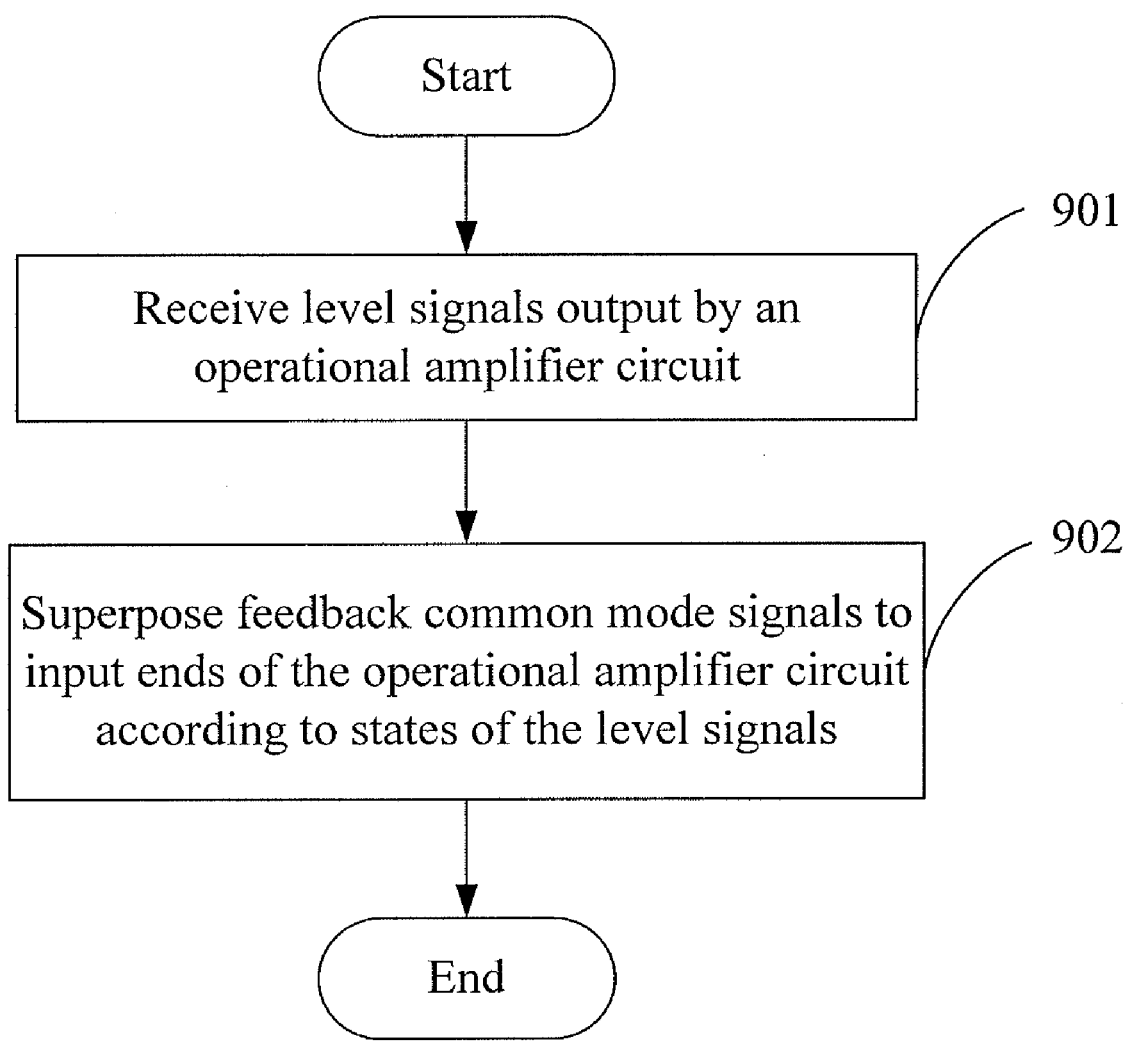
FIG. 9 is a flow chart of a method for eliminating feedback common mode signals according to a second embodiment of the present disclosure.

In the embodiment of the present disclosure a method for eliminating common mode signals in feedback circuits are provided. In the method, level signals output by a first output end and a second output end of an operational amplifier circuit are received. Common mode signals of feedback circuits can be reduced by superposing feedback common mode signals to the input ends of the operational amplifier circuit according to the states of the level signals. Referring to FIG. 9, this embodiment includes the following steps.

In Step 901, a feedback unit receives level signals output by a first output end and a second output end of an operational amplifier circuit.

The embodiment of the present disclosure can be applied in a class D amplifier. The newly added feedback unit includes a PMOS transistor, an NMOS transistor, an AND gate and an OR gate. In order to stabilize level feedback signals and protect feedback circuits, the feedback circuit may further include a protection circuit. The protection circuit includes two parallel resistors. Two input ends of the AND gate and the OR gate are connected to the two output ends of the operational amplifier circuit respectively. For the PMOS transistor, the source is connected to high level, the gate is connected to the output end of the OR gate, and the drain is connected to the protection circuit. For the NMOS transistor, the source is connected to low level, the gate is connected to the output end of the AND gate, and the drain is connected to the protection circuit. The other end of the protection circuit is connected to the two input ends of the operational amplifier circuit respectively.

The level signals output by the first output end and the second output end of the operational amplifier circuit may both be high level or low level at the same time, or the level signal output by the first output end is high level and the level signal output by the second output end is low level, or the level signal output by the first output end is low level, and the level signal output by the second output end is high level.

In Step 902, the feedback unit superposes feedback common mode signals to the input ends of the operational amplifier circuit according to states of the level signals.

When the level signals at the first output end and the second output end are high level, the control logics output by the AND gate and the OR gate are high level, the NMOS transistor is on, the PMOS transistor is off, the output end of the feedback unit is low level, two low level feedback common mode signals are superposed to the input ends of the operational amplifier circuit; or When the level signals at the first output end and the second output end are low level, the control logics output by the AND gate and the OR gate are low level, the PMOS transistor is on, the NMOS transistor is off, the output end of the feedback unit is low level, two high level feedback common mode signals are superposed to the input ends of the operational amplifier circuit; or When the level signal at the first output end is high level and the level at the second output end is low level, or the level signal at the first output end is low level and the level signal at the second output end is high level, the control logic output by the AND gate is low level, the control logic output by the OR gate is high level, both the PMOS transistor and the NMOS transistor are off, the feedback unit is in the virtual short state, and the newly added feedback signal is floating.

Before the implementation of the embodiment of the present disclosure, the operational amplifier circuit may be detected first. The signals at the output ends of the operational amplifier circuit may be high level or low level. The objective of stabilizing the feedback common mode levels can be achieved by adding the feedback unit in the operational amplifier circuit to superpose the feedback common mode signals to the input ends of the operational amplifier circuit according to the detected signals.

In the embodiment of the present disclosure, the feedback unit is added in the operational amplifier circuit, so that the overall value of the feedback common mode signals of the feedback circuits are kept constant, thereby solving the problem of instability of the feedback common mode signals and lowering the requirement for the input common mode range and the common mode rejection ratio of the operational amplifier circuit. Thus, the complexity of the circuit is lowered and the overall performance of the circuit is improved.

The embodiments described above are merely some preferred embodiments. Modifications and equivalent replacements within the scope of the technical solutions of the present disclosure made by persons skilled in the art shall fall within the protection scope of the present disclosure.

The invention claimed is:

1. A device for eliminating feedback common mode signals, comprising an operational amplifier circuit, wherein the operational amplifier circuit comprises two output ends, the two output ends are a first output end and a second output end, the device further comprising:
   a feedback unit, configured to receive level signals of the first output end and the second output end of the operational amplifier circuit, and superpose feedback common mode signals to input ends of the operational amplifier circuit according to the states of the level signals;
   wherein the feedback unit is further configured to:
      (a) superpose low level feedback common mode signals to the input ends of the operational amplifier circuit when both the level signals of the first and second output ends are high level and
      (b) superpose high level feedback common mode signals to the input ends of the operational amplifier circuit when both the level signals of the first and second output ends are low level; and
      (c) not superpose the feedback common mode signals to the input ends of the operational amplifier circuit when the level signals of the first and second output ends are of different values.

2. The device for eliminating feedback common mode signals according to claim 1, further comprising a protection circuit, wherein the protection circuit comprises a first parallel resistor and a second parallel resistor;
   one end of the first parallel resistor is connected to an output end of the feedback unit, and the other end of the first parallel resistor is connected to one input end of the operational amplifier circuit; and
   one end of the second parallel resistor is connected to the output end of the feedback unit, and the other end of the second parallel resistor is connected to the other input end of the operational amplifier circuit.

3. The device for eliminating feedback common mode signals according to claim 2, wherein the operational amplifier circuit comprises two input ends;
   the feedback unit comprises a P-type Metal-oxide semiconductor (PMOS) transistor, an N-type Metal-oxide semiconductor (NMOS) transistor, an AND gate and an OR gate; two input ends of the AND gate are connected to the first output end and the second output end of the operational amplifier circuit respectively; two input ends of the OR gate are connected to the first output end and the second output end of the operational amplifier circuit respectively; a source of the PMOS transistor is connected to high level, a gate of the PMOS transistor is connected to an output end of the OR gate, and a drain of the PMOS transistor is connected to the protection circuit; a source of the NMOS transistor is connected to low level, a gate of the NMOS transistor is connected to an output end of the AND gate, and a drain of the NMOS transistor is connected to the protection circuit.

4. A method for eliminating feedback common mode signals, comprising:
 receiving, by a feedback unit, level signals of first and second output ends of an operational amplifier circuit;
 superposing feedback common mode signals to input ends of the operational amplifier circuit according to states of the level signals, including
  (a) superposing low level feedback common mode signals to the input ends of the operational amplifier circuit when both the level signals of the first and second output ends are high level and
  (b) superposing high level feedback common mode signals to the input ends of the operational amplifier circuit when both the level signals of the first and second output ends are low level; and
  (c) not superposing the feedback common mode signals to the input ends of the operational amplifier circuit when the level signals of the first and second output ends are of different values.

5. The method for eliminating feedback common mode signals according to claim 4, further comprising:
 superposing, by the feedback unit, the feedback common mode signals to the input ends of the operational amplifier circuit through a protection circuit, wherein the protection circuit comprises a first parallel resistor and a second parallel resistor;
 one end of the first parallel resistor is connected to an output end of the feedback unit, and the other end of the first parallel resistor is connected to one input end of the operational amplifier circuit; and
 one end of the second parallel resistor is connected to the output end of the feedback unit, and the other end of the second parallel resistor is connected to the other input end of the operational amplifier circuit.

6. The method for eliminating feedback common mode signals according to claim 5, wherein:
 the feedback unit comprises a P-type Metal-oxide semiconductor (PMOS) transistor, an N-type Metal-oxide semiconductor (NMOS) transistor, an AND gate and an OR gate; two input ends of the AND gate are connected to the first output end and the second output end of the operational amplifier circuit respectively; two input ends of the OR gate are connected to the first output end and the second output end of the operational amplifier circuit respectively; a source of the PMOS transistor is connected to high level, a gate of the PMOS transistor is connected to an output end of the OR gate, and a drain of the PMOS transistor is connected to the protection circuit; and a source of the NMOS transistor is connected to low level, a gate of the NMOS transistor is connected to an output end of the AND gate, and a drain of the NMOS transistor is connected to the protection circuit.

* * * * *